United States Patent [19]
Hayes et al.

[11] Patent Number: 5,736,074
[45] Date of Patent: Apr. 7, 1998

[54] MANUFACTURE OF COATED SPHERES

[75] Inventors: Donald J. Hayes; Mary W. Hartnett, both of Plano, Tex.

[73] Assignee: Micro Fab Technologies, Inc., Plano, Tex.

[21] Appl. No.: 496,972

[22] Filed: Jun. 30, 1995

[51] Int. Cl.$^6$ .................................................. B29B 9/10
[52] U.S. Cl. ................................... 264/6; 264/7; 75/332
[58] Field of Search ...................... 264/6, 7, 10, 9; 75/332, 336; 427/123, 125, 126.1, 197, 199, 216, 217

[56] References Cited

U.S. PATENT DOCUMENTS

| | | | |
|---|---|---|---|
| 4,355,057 | 10/1982 | Slaughter | 427/216 |
| 4,426,337 | 1/1984 | Suzuki et al. | 264/4 |
| 4,801,411 | 1/1989 | Wellinghoff et al. | 264/7 |
| 5,053,100 | 10/1991 | Hayes et al. | 3/2 |
| 5,063,011 | 11/1991 | Rutz et al. | 264/126 |
| 5,153,092 | 10/1992 | Kao et al. | 264/7 |
| 5,193,738 | 3/1993 | Hayes | 3/8 |
| 5,229,016 | 7/1993 | Hayes et al. | |
| 5,377,902 | 1/1995 | Hayes | 1/20 |
| 5,411,602 | 5/1995 | Hayes | 35/34 |

FOREIGN PATENT DOCUMENTS

| | | | |
|---|---|---|---|
| 1-176008 | 7/1989 | Japan | 75/332 |

*Primary Examiner*—Mary Lynn Theisen
*Attorney, Agent, or Firm*—Locke Purnell Rain Harrell; Harry J. Watson

[57] ABSTRACT

Solid spheres of substantially uniform size and shape and coated with a lower temperature melting material are formed for use in interconnect arrays, solder pastes, Z-axis conduction adhesives, etc. Drops of two materials are merged in flight forming a coating of the lower melting temperature material on the drop of higher melting temperature material.

17 Claims, 8 Drawing Sheets

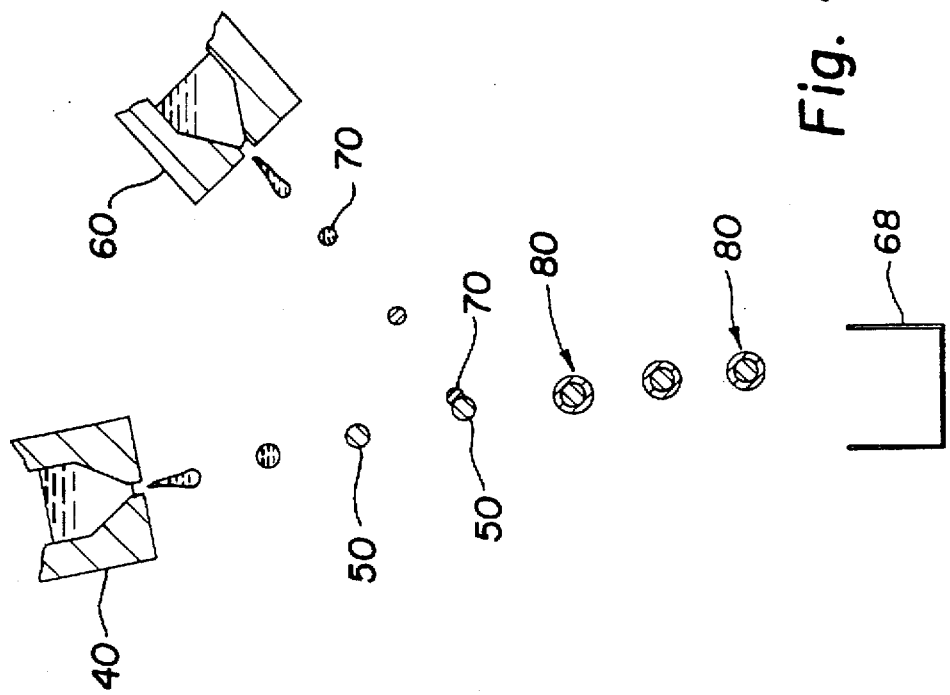
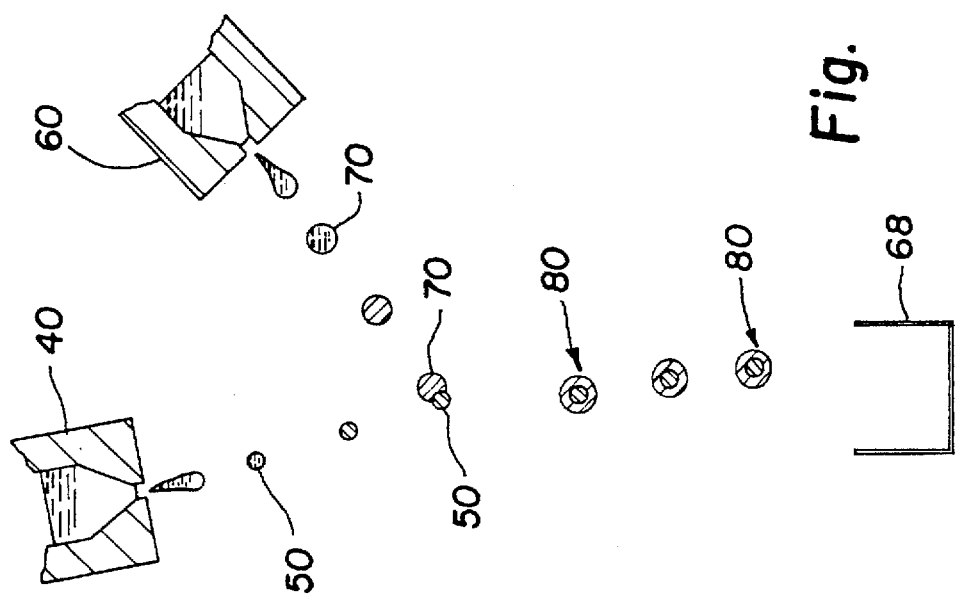

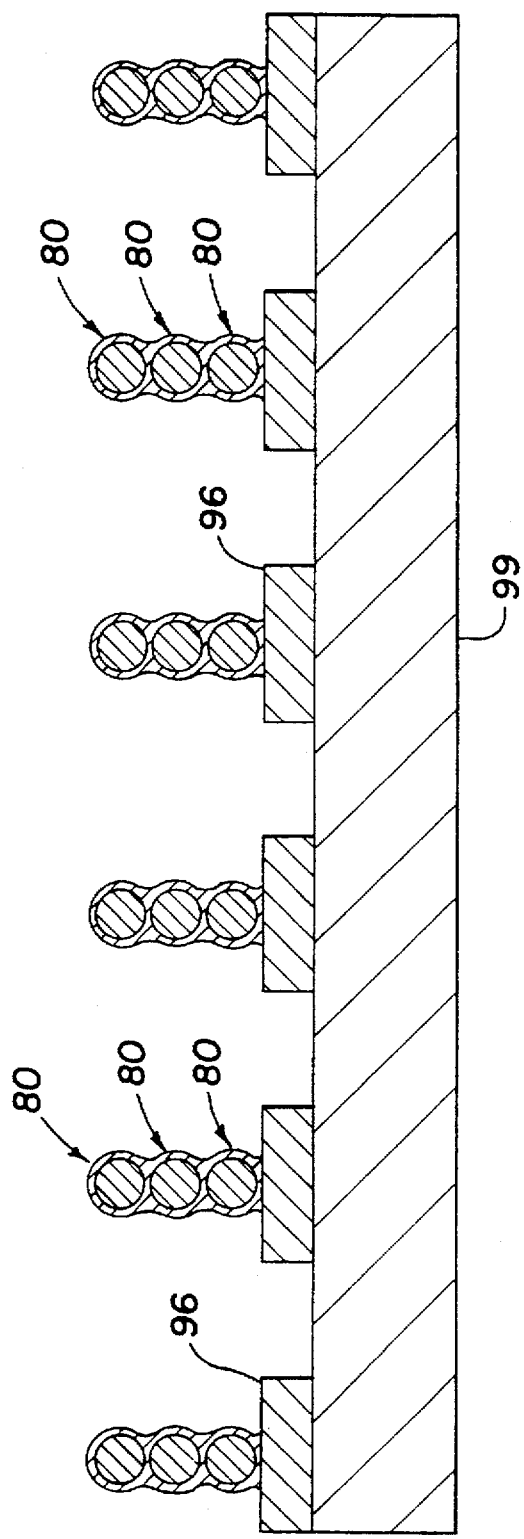

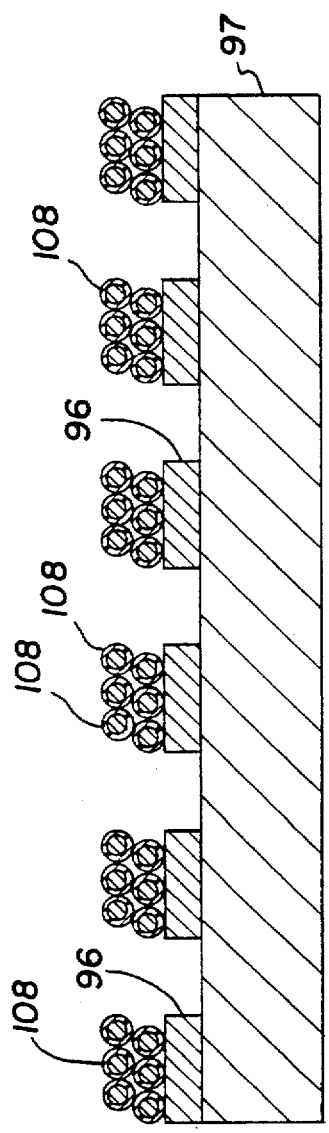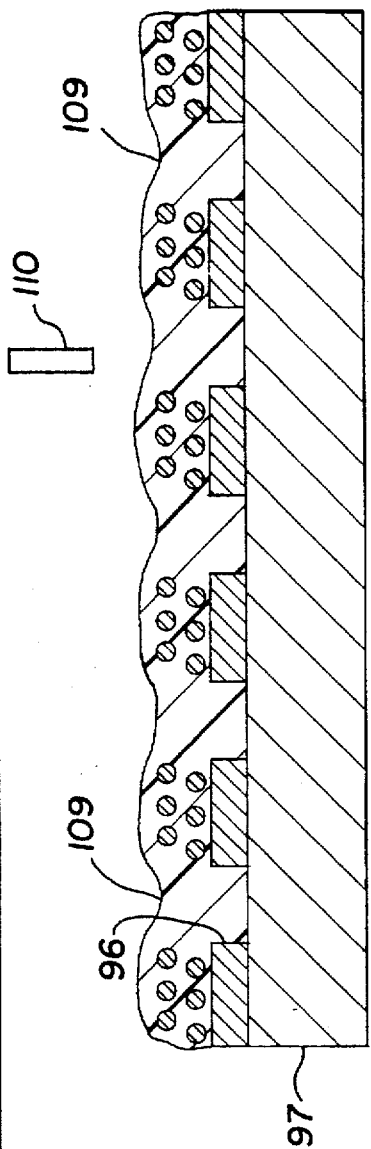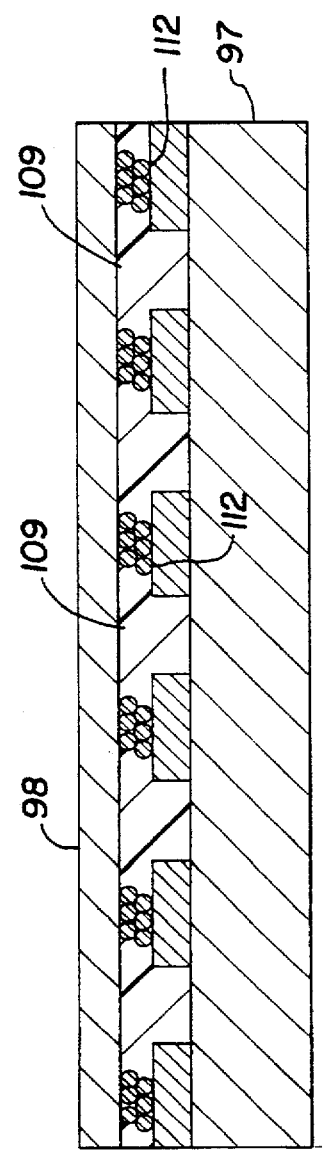

MANUFACTURE OF COATED SPHERES

This invention relates to coated spheres and methods of making same. More particularly, it relates to merging of droplets of two liquid materials having different melting temperatures to form a coating of the lower melting temperature material around a sphere of the higher melting temperature material and to uses of such coated spheres.

Although this invention is applicable to dispensing and merging various liquid materials, it is particularly useful in creating electrically conductive spheres coated with a layer or coating which may be electrically conductive or nonconductive. For brevity and clarity of disclosure the invention is described herein with specific reference to electrically conductive spheres without limiting the applicability of this invention to any particular product.

In high density electronic manufacturing processes, surface mountable microelectronic devices are bonded to a substrate by a solder reflow process. The interconnect material between the microelectronic device and the substrate is usually a solder bump or ball formed prior to the reflow process by any of various prior art processes which include deposition through a mask, electroplating, pick-and-place, evaporation, sputtering, screen printing, etc. Techniques for forming bumps for electrical interconnections are usually costly and require hard tooling. In addition, many steps are required when using photoresist masks and expensive photolithography equipment is needed. With flip-chip methods, additional chip processing steps are required.

In an effort to improve reliability of the solder joint a number of expensive and labor or space intensive steps have been tried which include adding a control electrode to the chip surface, stacking solder bumps separated by polyamide sheets, casting a copper helix in a solder column, etc.

In the area of solder pastes, existing methods of creating solder balls for solder paste require a large quantity of solder. It has been difficult to control the size of the solder balls and costly screening steps have been required to size the solder balls once they are produced. Extreme care must be taken to control the amount of oxide on the surface of the solder balls until the solder paste is formulated.

Z-axis conductive adhesives are generally expensive to manufacture since it is expensive to obtain uniformly sized metal particles or balls and the random spacing of metal particles or balls within the resin must be tightly controlled to prevent conduction in the X-axis and Y-axis directions. The percentage of metal particles or balls is limited; the minimum bonding pitch is limited; and the selection of polymer resins is limited to a film (at room temperature) or a b-staged adhesive since a liquid polymer at room temperature would allow movement and settling of the conductive metal particles or balls.

A number of applications and advantages exist for coated metallic balls in electronic interconnect and packaging. The production of flux, polymer or solder-coated solder balls (or solder-coated copper balls) would be useful for producing solder pastes. Higher melting temperature metals such as copper allow for stand-offs in the paste for controlled bond lines or interconnect heights in the final solder joint.

Metal or polymer-coated balls may also be used for flip-chip or ball grid array applications. The coated balls may be produced and then placed onto the device or the balls may be ejected or jetted directly onto the device. A solder-coated copper ball placed on a chip or ball grid array package will provide a stand-off or controlled distance bond line after reflow. Varying sizes of balls may be placed on the device to compensate for stresses due to thermal mismatch between the device and the substrate. Size variations of the balls required may be determined with finite element modelling for each configuration. In addition, multiple coated metal balls may be printed to form three-dimensional stacking to compensate for coplanarity problems or as stress relief mechanisms for microelectronic bonding. For flip-chip bonding, it has been found that a stretched joint shape (height greater than width) provides the best reliability. The shape and dimensions of a joint or bond line can be optimized for maximum performance and reliability. In addition to improved electrical performance, improved thermal performance (which is critical with increasing heat generation of complex ultra dense semiconductor chips) may also be achieved.

Flux-coated or polymer-coated metal balls may be used in other electronic applications. A solder ball coated with a tacky flux may be ejected or printed onto a substrate and stored without degradation of the solder to be reflowed at a future time. The flux surrounding the solder ball maintains an oxide-free surface on the solder ball and provides surface activation for reflow of the solder ball when the interconnect joint is formed. Flux-coated solder balls may also be used for flip-chip, ball grid array and fine pitch surface mount applications. A polymer-coated metal ball (solder, copper, gold or nickel alloy) provides the same benefits as the flux-coated solder ball (maintaining an oxide-free surface until interconnection), but the polymer acts as a mechanical bond to hold the metal ball in electrical contact with the two interconnecting surfaces. This application is similar to an anisotropically conductive Z-axis adhesive but metal balls can be placed only where the interconnect is required so a higher density ball can be used to improve electrical performance and minimize allowable bonding pitches since concerns of X and Y axis conduction between leads is eliminated. The remaining area of the device surface may be filled with only the polymer material. Upon curing/melting of the polymer under pressure, the metallic particles are pressed together forming an electrical interconnect path in the Z-axis between the two electrodes.

It is believed that coated metal balls may be used in any electronic application where electrical or thermal conductivity is required between two surfaces and/or where a controlled thickness bond line is required. For example, solder-coated copper balls may be used to attach heat sinks. Metal-coated balls, such as polymer-coated aluminum, may also be used in aerospace applications where reduced weight is critical while maintaining structural integrity.

In accordance with the present invention solid coated spheres are produced with substantially uniform size and shape for use in interconnect arrays, solder pastes, Z-axis conduction adhesives, etc. Liquid-ejecting apparatus creates and merges drops of two materials to form a coating of the lower melting temperature material around a drop of the higher melting temperature material. The first material is maintained in a liquid state in a first ejection device. A second material (having a lower melting temperature than the first material) is maintained in a liquid state in a second ejection device. Generally spherically-shaped liquid drops of the first material are ejected from the first ejection device in a line-of-flight, the spherically-shaped liquid drops of the liquid first material becoming generally solidified spheres of first material during flight. Generally spherically-shaped liquid drops of a second material are ejected from a second ejection device toward the same line-of-flight. Ejection of the generally spherically-shaped liquid drops of a second material is synchronized with ejection of the generally spherically-shaped liquid drops of the first material so that an individual sphere of the second material collides with an individual sphere of the first material. The individual sphere of the second material is liquified or maintained liquid by the heat of the sphere of the first material and the liquified second material flows around the outer surface of the solidified sphere of the first material to form a unitary sphere consisting of a central solid core of the first material coated with the second material. The resulting solid coated spheres may be caught in a container for use in producing solder pastes or the like or may be directed onto wettable metal pads of electronic devices or the like. Other advantages and features of the invention will become more readily apparent from the following detailed description taken in connection with the appended claims accompanying drawing wherein like reference numerals have been applied to like elements and in which:

FIGS. 3, 4a and 4b are simplified enlarged pictorial illustrations of the process of forming coated spheres in accordance with the invention;

FIG. 8 is a sectional view of stacked coated spheres formed on pads of an electronic device in accordance with the invention; and FIGS. 9a–9c are sectional views of an electronic device using one process of the invention to form bonds to a substrate.

Figure 1:
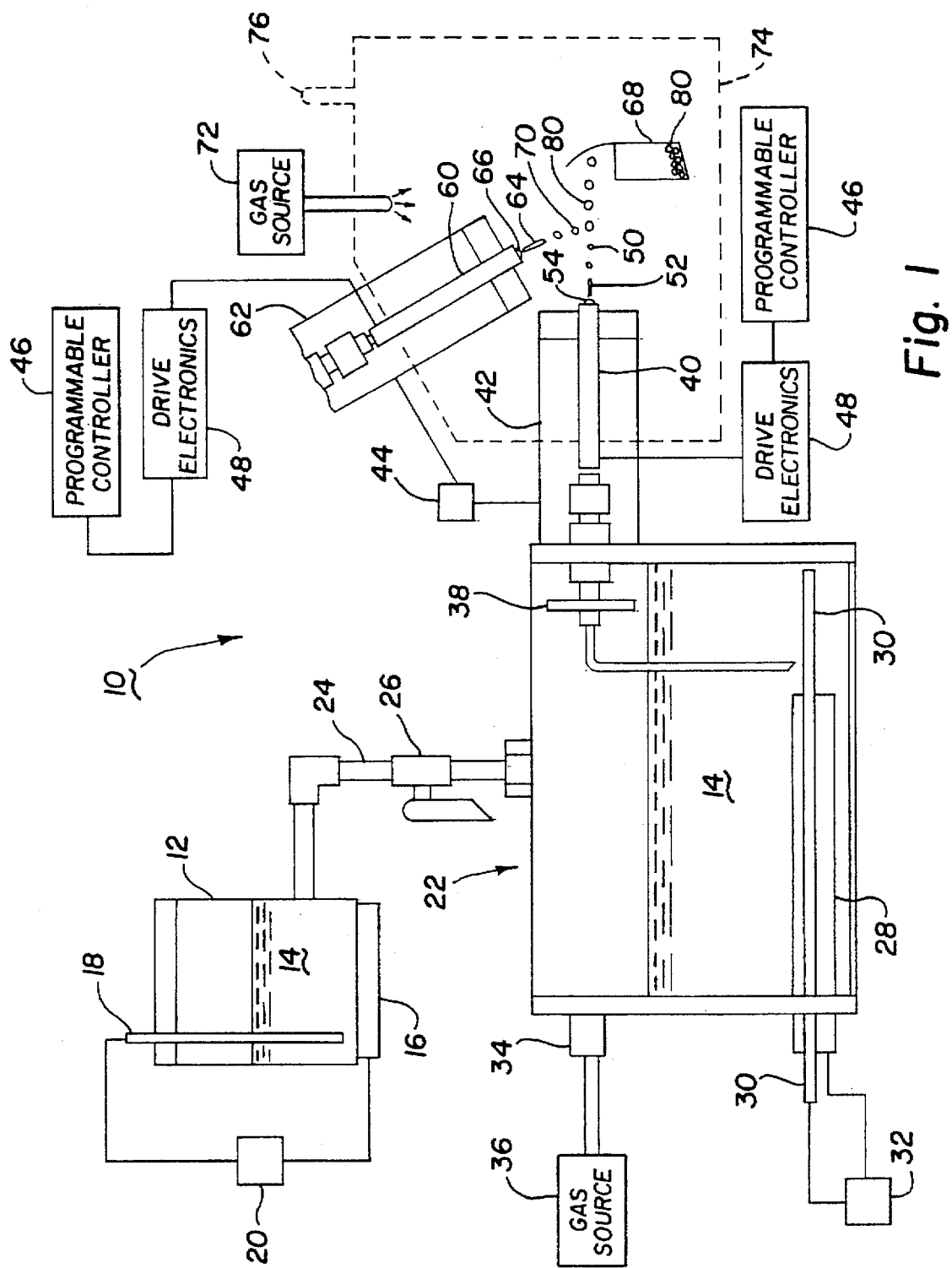
FIG. 1 is a simplified pictorial illustration of apparatus for forming coated metal spheres in accordance with one embodiment of the present invention.

FIG. 1 illustrates one embodiment of apparatus (generally designated by reference character 10) for producing coated spheres in accordance with the invention. Apparatus 10 creates and merges drops or droplets of two materials resulting in a coating of the lower melting temperature material around the drop or droplet of the higher melting temperature material. For best results, the higher melting temperature should have a melting point at least about 25° C. higher than the lower melting temperature.

For purposes of illustration, copper and solder will be discussed herein as the materials used in making coated spheres in accordance with the invention. It will be appreciated, however, that many other materials may be used in various combinations.

In the embodiment of FIG. 1, apparatus 10 comprises a preload reservoir 12 for initially receiving and holding the copper 14 (or other higher melting temperature material) in a liquid state. Heating element 16 is operatively positioned with respect to preload reservoir 12 to maintain the copper 14 liquid. Thermocouple 18 (or other temperature monitoring device) is operatively coupled to control power source 20 so the copper 14 is maintained liquid. An ejection chamber 22 is connected to the outlet of preload reservoir 12 through conduit 24 and valve 26 to allow liquid copper 14 to flow from the preload reservoir 12 into ejection chamber 22. Depending on the material used, the preload reservoir may not be necessary.

Heating element 28 is operatively positioned in ejection chamber 22 and thermocouple 30 is operatively coupled to power source 32 to control heating element 28 to maintain the copper 14 liquid. The ejection chamber 22 is pressurized through inlet port 34. Inert gas from gas source 36 forces liquid copper 14 through filter 38 into ejection device 40 in preparation for operation. Ejection chamber 22 is pressurized during operation with an inert gas to eliminate oxygen from the atmosphere above the liquid copper 14.

Heater 42 surrounds ejection device 40 and controls the temperature of the liquid copper 14 within ejection device 40. Heater 42 is operatively connected to power source 44. Programmable controller 46 provides activating signals to drive electronics 48 whose output causes ejection device 40 (which is a continuous type ejection device) to form drops 50 of liquid copper 14 from the liquid copper stream 52. The drops 50 are ejected from orifice 54 under pressure from gas source 36.

Ejection device 40 is preferably an electro-mechanical transducer and may be a piezoelectric, electro-magnetic or other electro-mechanical source which causes the liquid copper stream 52 to break into drops 50 of liquid copper 14 in response to an excitation signal from drive electronics 48. If the material used in making the drops has a melting point above the active range of the transducer, the transducer must be removed from the hot zone and mechanically coupled to the molten fluid tube of the ejection device. For example, a piezoelectric transducer should be kept below 300° C. to function properly. If copper (which has a melting point of about 1000° C.) is to be ejected, the transducer is removed from the hot zone and mechanically coupled to the molten fluid tube. If 63/37 solder (which has a melting point of about 185° C.) is ejected, the transducer may remain in the hot zone and function properly.

The portion of the apparatus 10 which provides liquid to ejection device 60 to form the lower melting temperature material for coating the copper spheres or balls has been omitted from FIG. 1 for clarity. It will be appreciated that the necessary components are substantially the same as shown for making the higher temperature melting balls. For illustrative purposes, heater 62 is shown operatively connected to a power source 44. Programmable controller 46 provides activating signals to drive electronics 48 whose output causes ejection device 60 (which is also a continuous type ejection device) to form drops 70 of liquid solder from the liquid solder stream 64 ejected from orifice 66 under pressure from a gas source (not shown).

Ejection device 60 is an electro-mechanical transducer as described above which causes the liquid solder stream 64 to break into drops 70 of liquid solder in response to excitation signals from drive electronics 48.

The space surrounding orifices 54 and 66 and the drops 50 of liquid copper and the drops 70 of liquid solder between ejection devices 40 and 60 and container or catcher 68 is filled with a relatively inert gas such as nitrogen or helium to eliminate oxygen from the path traveled by the drops. As shown, a gas source 72 provides a flow of inert gas through housing 74 which encloses the path traveled by the drops and the container or catcher 68. The housing 74 may be used to provide a positive gas flow from gas source 72 to outlet 76. Thus oxides and/or contaminants removed from the space will flow out through outlet 76 along with the inert gas and will not be deposited on the drops. The inert atmosphere also greatly enhances formation of generally spherical drops 50 and 70 of liquid copper and liquid solder, respectively.

Ejection devices 40 and 60 are physically aligned and electronically driven so that an ejected drop 50 of copper will meet in flight and merge with an ejected drop of solder to form a solder-coated copper ball 80. As the drop 50 of copper is ejected, it cools very rapidly and is essentially solid by the time it merges with drop 50. However, copper drop 50 retains sufficient heat energy to liquify solder drop 70 (or maintain it liquid) so that the solder will flow around drop 50 and completely coat the outside surface of drop 50, forming solder-coated copper ball 80. The resulting solidified solder-coated copper balls 80 are collected in container or collector 68. Coated balls can be produced in sizes with diameters ranging from about 20 μm to about 1000 μm. Accordingly, chamber or housing 74 should be long enough to allow the solder-coated copper balls 80 to solidify before reaching catcher 68.

Ejection devices 40 and 60 are precisely controlled to produce a stream of drops 50 and 70, respectively, which are spherical in shape and are reproduceably precise in diameter. In the preferred embodiment, ejection devices 40 and 60 have orifice openings of about ten (10) to about five hundred (500) μm in diameter and are excited with signals from drive electronics 48 having a frequency between about two thousand (2,000) to about one million (1,000,000) hertz. Changes in the amount or volume (and the diameter) of the drops are controlled by the excitation frequency provided to ejection devices 40 and 60 and the sizes of orifices 54 and 66. Small changes in diameter (and volume) of the drops require only changes in excitation frequency. Large changes require changes in the sizes of orifices 54 and 66.

Apparatus 10 produces spherically shaped quantities of liquid copper and liquid solder which are merged in flight. The copper droplets cool in flight, allowing the copper droplet to solidify before merging with the solder droplet. As the solder droplet is merged with the hot, clean (oxide-free) copper droplet, the solder droplet melts (or remains melted) and reflows to wet the entire outer surface of the copper sphere, forming a solder-coated copper ball. Other metal/alloy combinations are possible so long as there is enough difference in melting temperatures to allow the higher melting temperature metal to solidify while retaining enough heat to maintain the lower melting temperature sphere liquid so that the lower melting material can coat the higher temperature melting sphere upon merging. Suitable examples of appropriate metal balls are copper, gold, aluminum, nickel and alloys thereof. Other metal combinations are possible, such as an aluminum-coated copper balls and high melting temperature solder (as low as about 100° C.) coated with low melting temperature solder (up to as high as about 350° C. or higher). Other materials such as polymers and fluxes could be merged with metal balls to form coated balls.

The size of the spheres or balls which can be produced ranges from a few microns to hundreds of microns in diameter. The ejection process allows production of very uniformly sized balls (less than 5% variation) and, by appropriately changing process parameters, any size of ball within the range can be produced. It is also possible to control the coating thickness by controlling the relative sizes of the drops prior to merging.

Figure 2:
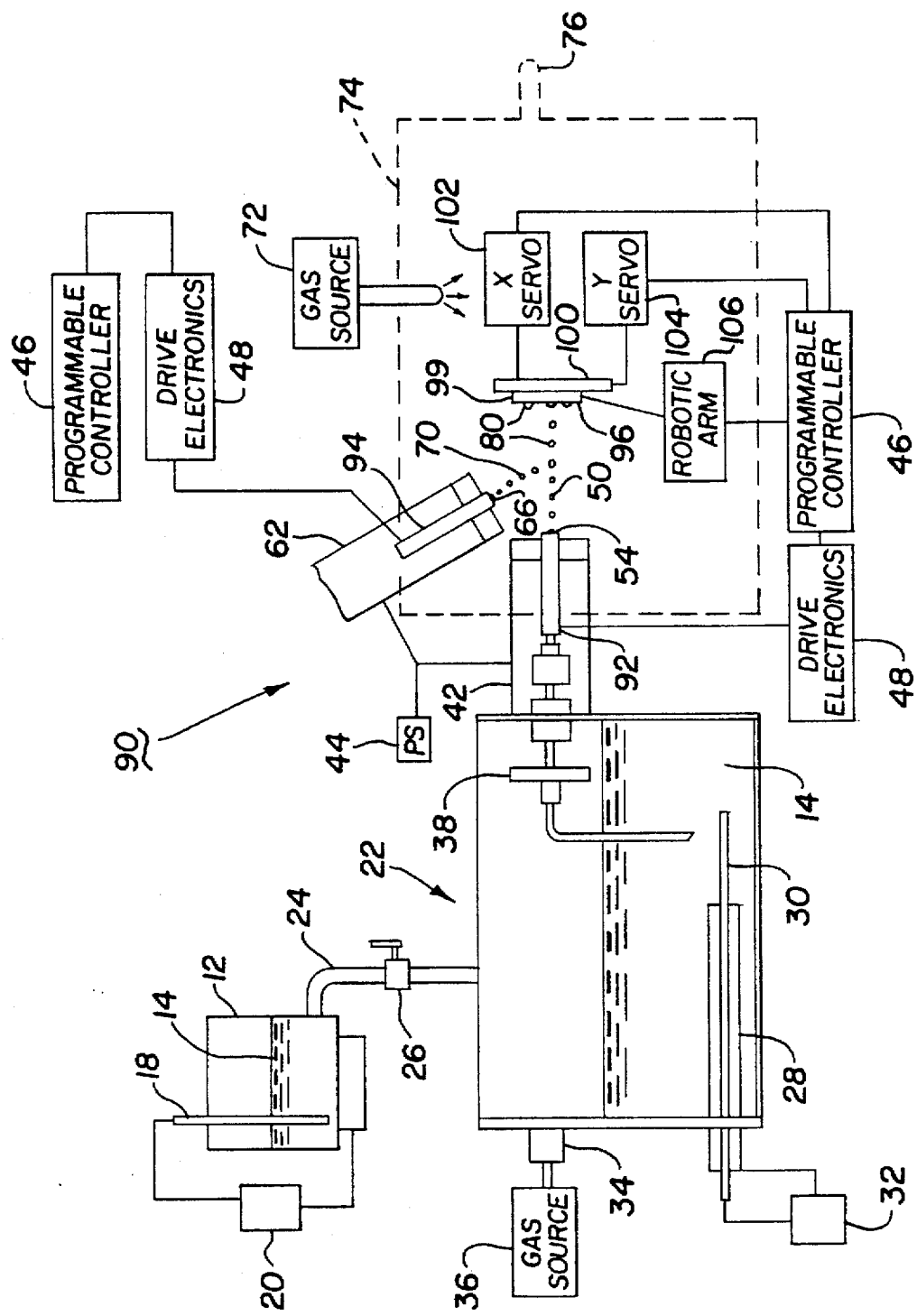
FIG. 2 is a simplified pictorial illustration of another embodiment of apparatus for forming metal coated spheres.

Apparatus 90 of FIG. 2 uses drop-on-demand ejection devices. These are shown ejecting or printing solder-coated copper balls 80 directly onto wettable metal pads 96 on an element 99 such as a microelectronic device or the like. Apparatus 90 otherwise is essentially the same as shown in FIG. 1. However, in the embodiment of FIG. 2 an X-Y table 100 is provided on which the element 99 is mounted. The X-Y table 100 is equipped with an X-axis positioning servo 102 and a Y-axis positioning servo 104. Programmable controller 46 is operatively connected to the X-axis positioning servo 102 and the Y-axis positioning servo 104 and provides programmed control signals thereto to move the X-Y table 100 to a particular desired location and/or a predetermined sequence of locations with respect to ejection devices 92 and 94. A robotic arm 106, controlled by control signals from programmable controller 46, may be provided to control the position of the element 99.

Figure 3:
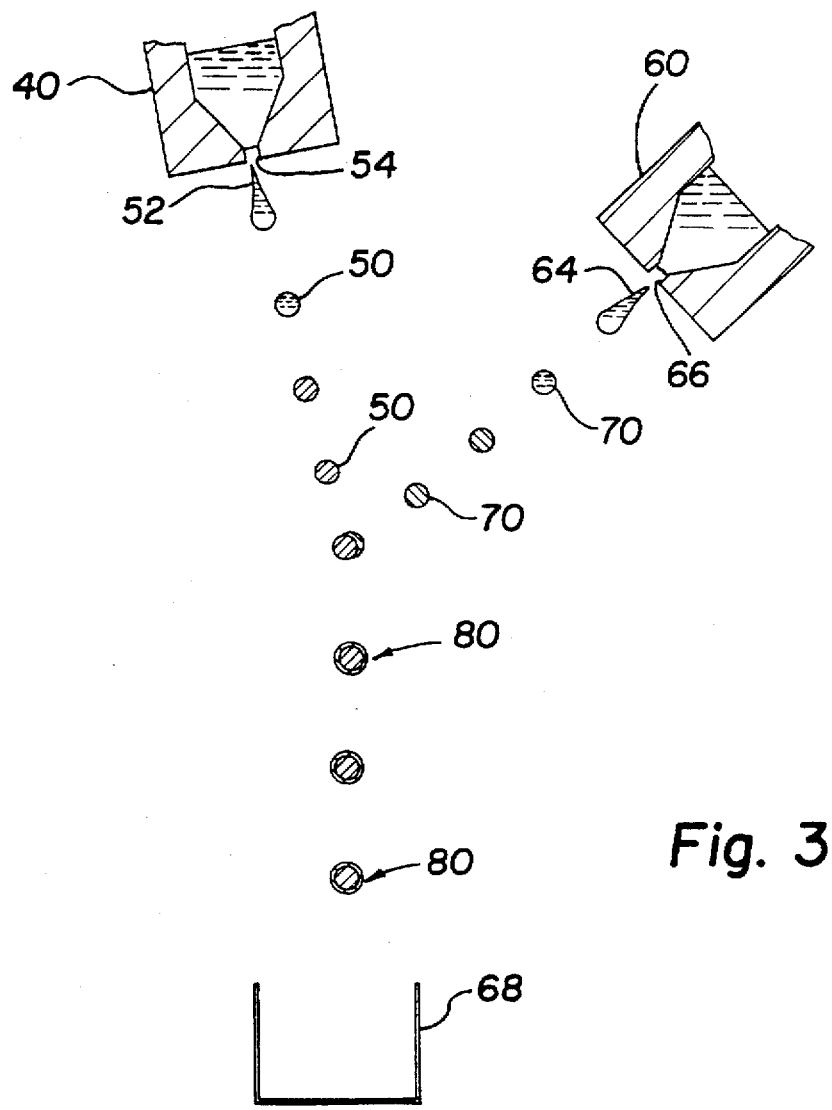

A magnified illustration of the process of forming solder-coated copper (or other material) balls 80 is shown in FIG. 3. Upon excitation of ejection device 40 by drive electronics 48, drops 50 are formed from the liquid stream 52. At the programmed time, ejection device 60 is excited by drive electronics 48 to form drops 70 of solder from the liquid solder stream 64. By the time drop 70 of solder contacts drop 50, drop 50 is essentially solid but still contains sufficient heat to cause the drop 70 of solder to reflow and completely coat the outside surface of drop 50. The coated solidified balls are collected in collector 68.

FIGS. 4a and 4b illustrate formation of solder-coated copper (or other metal) balls having different ratios of component metals. In FIG. 4a the thickness of the solder coating is much greater than that formed in FIG. 4b as is readily apparent from the relative sizes of drops 50 and 70. As previously noted, the size of each drop may be varied as desired by changing the sizes of orifices 54 and/or 66 and by changing the excitation frequency applied by drive electronics 48.

Solder pastes, which are generally composed of powdered solder alloy dispersed in a relatively small volume of a carrier vehicle, are sometimes used for attaching microelectronic devices to printed circuit boards and other electronic substrates. Although solder pastes may comprise different components, the pastes generally are comprised of a solder powder (which is a distribution of solder particles); flux to promote wetting of the metal to be soldered by removing oxides and contaminates from the surfaces to be joined; and viscosity control agents comprising rheological polymers to control the rheological properties which influence the deposition characteristics of the solder paste. Solvents may be included to aid in the flux activation process and to improve shelf life of the flux. It will be appreciated that the invention may be employed to produce solder-coated solder balls (low melting temperature solder coating a high melting temperature solder) and/or solder-coated copper balls which could be used in making solder pastes. Coated balls of different diameters may be made of the same metal alloys or of different metal alloys. The higher melting temperature balls allow for standoffs in the paste for controlled bond lines or interconnect heights in the final joint (see FIG. 6). The coated ball diameters may be chosen to increase or to decrease the total weight percent of solder in the solder paste; to improve the application thereof; to allow precise modification of the final alloy composition; etc.

The solder in solder-coated balls can be an alloy of at least two metals selected from the group consisting of tin, bismuth, nickel, cobalt, cadmium, antimony, indium, lead, silver, gallium, aluminum, germanium, silicon, gold, etc. Solder alloys may be eutectic alloys but that is not required. The carrier or vehicle in the solder paste can comprise several components which may include (but are not limited to) rosin or derivatives thereof, organic solvents, thixotropic agents, active hydrogen-containing compounds, diluents, polymers, fluxes, etc.

It will be appreciated that solder pastes could be made which include coated balls of only one diameter or with various combinations of coated balls of different diameters within the capability of the present invention. Because the diameters of the coated balls provided by the present invention are precisely controlled, the diameters of the coated balls can be chosen to develop solder pastes which are tailored for specific applications not previously obtainable. For example, balls of various sizes may be used and balls coated with flux or solder may be used. In the preferred embodiment, the solder paste is formed using a carrier vehicle and solid coated spheres wherein the solid coated spheres comprise at least about 80% by weight of the paste.

Figure 5:
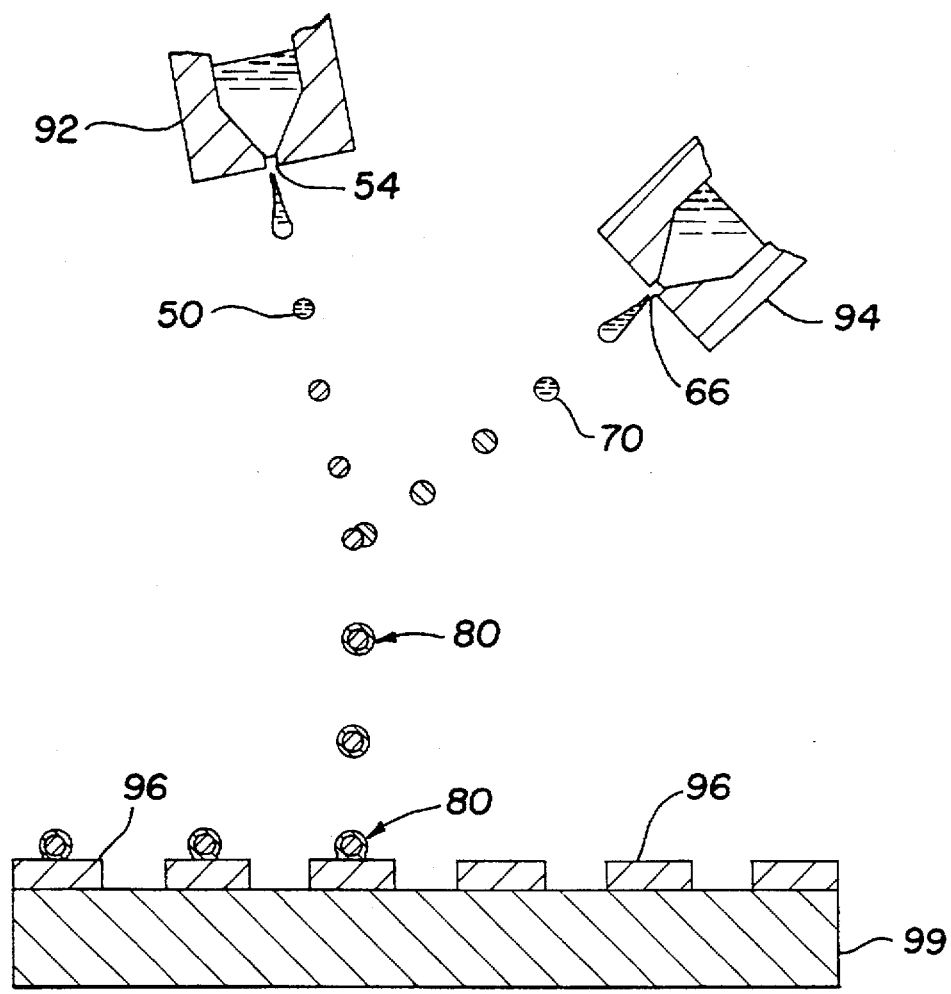
FIG. 5 is a simplified enlarged pictorial illustration showing formation of coated spheres directly on pads of an electronic device.

FIG. 5 illustrates formation of solder-coated copper (or other material) balls 80 directly on wettable metal pads 96 on an element 99 such as a microelectronic device or the like to provide an interconnect array. As described above with reference to FIG. 2, the element 99 is moved by programmable controls so the solder-coated copper (or other material) balls 80 are deposited at the correct locations. When the element 99 is properly positioned, the solder-coated copper (or solder) balls 80 still contain sufficient heat to permit them to stick to the wettable metal pads 96. It will be appreciated that the wettable metal pads 96 and/or the element 99 could be heated if necessary.

It will be appreciated that the process illustrated in FIG. 5 may also be used to form flux-coated metal balls (flux-coated solder or flux-coated copper, etc.) or polymer-coated metal balls (polymer-coated solder or polymer-coated copper, etc.). A solder ball coated with a tacky flux may thus be printed in place on a substrate and stored for future reflow without degradation. The flux surrounding the ball maintains an oxide-free surface and provides surface activation for reflow when the interconnect joint is formed. Flux-coated solder balls may be used for flip-chip, ball grid array, fine pitch surface mount applications and the like.

A polymer-coated metal ball (solder, copper, gold, nickel, alloy, etc.) may provide the same benefits as a flux-coated solder ball (maintaining an oxide-free surface until interconnection) but the polymer coating may also provide a mechanical bond to hold the metal balls in electrical contact with the two interconnection surfaces. This application performs similarly to anisotropically conductive Z-axis adhesives. The metal balls, however, are easily be placed only where the interconnect is required so a higher density of balls may be used to improve electrical performance and minimize allowable bonding pitches.

Figure 6:
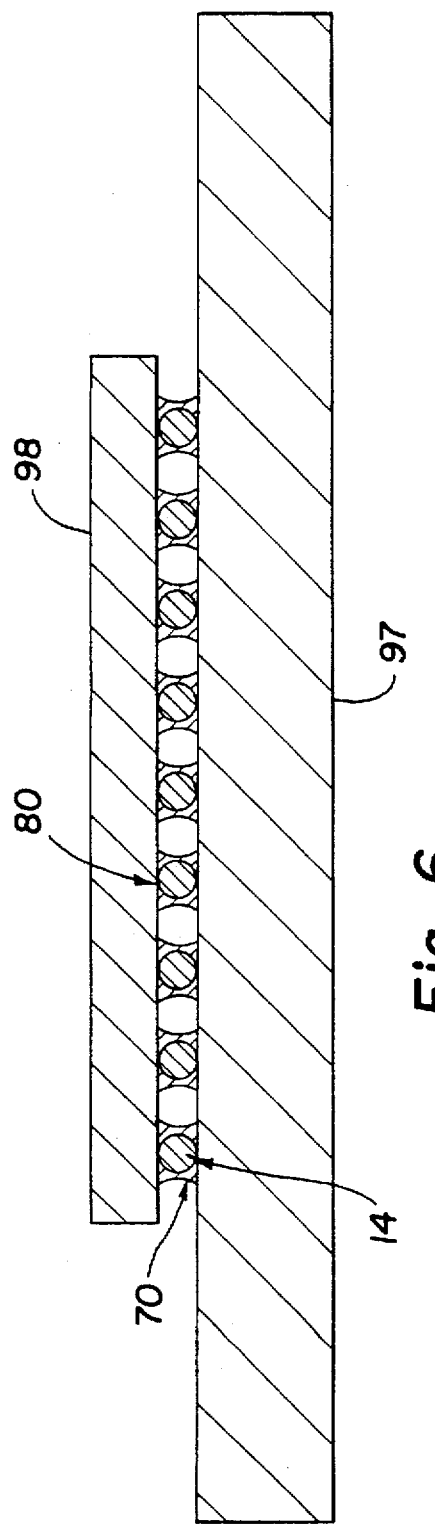
FIG. 6 is a sectional view of a microelectronic device operatively joined to a substrate by an interconnect array of spheres.

FIG. 6 is a magnified illustration showing a microelectronic device 98 operatively joined to substrate 97 using an interconnect pattern of spheres or balls of higher melting temperature conductive material coated with a lower melting temperature material (such as solder-coated solder balls or solder-coated copper balls 80, etc.) after the solder reflow process has been completed. The solder-coated copper balls 80 (or solder-coated solder balls) are generally of the same overall size. It will be appreciated that the temperature for the reflow process is controlled so that only the solder coating reflows and not the copper (or higher melting temperature solder). Use of copper provides additional advantages which include controlling bond-line thickness and providing lower electrical resistance than solder so the electrical performance of the connection or joint is improved.

Figure 7:
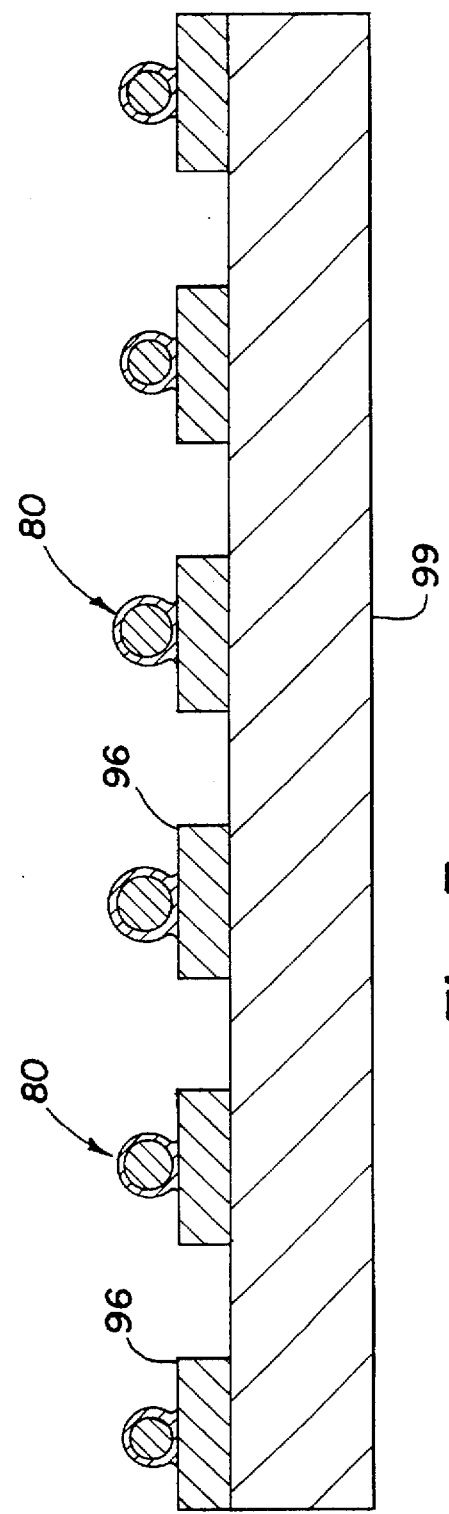
FIG. 7 is a sectional view of coated spheres formed directly on pads of an electronic device.

FIG. 7 illustrates the arrangement of various sizes of spheres of higher melting temperature conductive material with a lower melting temperature material such as solder-coated copper balls 80 (or solder-coated solder balls) on element 99 (substrate 97 or a microelectronic device 98) to provide an interconnect pattern of solder-coated copper (or solder) balls 80. Varying sizes of balls 80 may be placed between substrate 97 and a microelectronic device 98 to compensate for stresses due to thermal mismatch between the substrate 97 and the microelectronic device 98. Size variation and placement of the solder-coated copper (or other material) balls 80 may be determined with finite element modelling for each configuration. The various solder-coated balls 80 may be deposited directly on the wettable metal pads 96 of element 99 (substrate 97 or a microelectronic device 98) as desired.

FIG. 8 illustrates the arrangement of solder-coated copper (or solder) balls 80 which are stacked on top of each other on the wettable metal pads 96 of element 99. To form the structure of FIG. 8, a first layer of solder-coated copper (or other material) balls 80 is deposited on the wettable metal pads 96. When the solder-coated copper (or other material) balls 80 have cooled sufficiently, another layer of solder-coated balls 80 is printed directly onto the first layer. When the solder-coated balls 80 of the second layer have cooled sufficiently, another layer of solder-coated balls 80 is printed directly onto the second layer, etc., until the desired height of solder-coated balls 80 is obtained. The subsequent layers of solder-coated balls 80 may be formed while the previous layer is still warm so that when the subsequent solder-coated balls 80 contact the previous solder-coated balls 80 the subsequent balls stick to the previously formed balls. This arrangement of tall thin stacks of solder-coated copper (or other material) balls 80 may be placed between substrate 97 and a microelectronic device 98 to compensate for coplanarity problems or as a stress relief mechanism for microelectronic bonding. It has been found that for flip-chip bonding a stretched joint shape (height greater than width) provides the best reliability. It will be appreciated that the stacks of solder-coated balls 80 need not be of the same height. For example three layers of solder-coated balls 80 may be formed around the outer portion of element 99 and two layers of solder-coated balls 80 formed in the center portion, etc.

The shape and dimensions of a joint or bond line can be optimized for maximum performance and reliability. In addition to improved electrical performance with solder-coated copper balls, improved thermal performance (which is critical with increasing heat generation of complex ultra dense semiconductor chips is also achieved.

FIGS. 9a–9c illustrate polymer-coated balls which are stacked on the wettable metal pads 96 of element 99 to form a conductive adhesive bond between a microelectronic device 98 and a substrate 97. In prior processes of forming conductive adhesive bonding, the polymer used to hold randomly dispersed conductive metallic particles is in the form of a film at room temperature. Only small numbers of randomly dispersed conductive particles are mixed in the film to avoid conductive metallic particles touching each other in the X and Y directions since conductivity in only the Z direction is desired. It is obviously very difficult to control the random dispersion of the conductive particles in making of the film.

As shown in FIG. 9a, a first layer of polymer-coated metal balls 108 is printed directly onto the wettable metal pads 96, followed by another layer and additional layers, if desired, etc. It will be appreciated that the apparatus of FIG. 2 may be used to produce such layers using polymer and copper, etc.

As illustrated in FIG. 9b, the same polymer 109 has been dispensed (by conventional apparatus through dispenser nozzle or tip 110) to fill the areas between the wettable metal pads 96. Conventional processing is then used to place the microelectronic device 98 on the polymer 109 and polymer-coated metal balls 108 and apply heat and pressure, forming the structure of FIG. 9c. It will be appreciated that conductivity occurs only in the Z direction between the wettable metal pads 96 and the desired conductive areas on the microelectronic device 98 through the metal balls 112.

It will be appreciated that the present invention permits formation of spheres of one material coated with a lower melting temperature material. The lower melting temperature material can be a polymer, flux, solder, glass, wax, metal or mixture, solution or alloy of metals, while the higher melting temperature material can be almost any material which has a higher melting point and can be ejected in drops. In the presently preferred applications, materials such as aluminum, lead, tin, copper, gold, nickel, bismuth, gallium, silicon, cobalt, cadmium, antimony, silicon, germanium, tellurium, indium and mixtures, solutions or alloys of two or more of such metals may be used. The resulting coated balls can be used in electronic applications where electrical or thermal conductivity is required between two surfaces; where a controlled thickness bond line is required; where conductivity needs to be limited to the Z direction only and/or where reduced weight is critical while maintaining structural integrity, etc. Although the invention has been described with particular reference to presently preferred embodiments thereof, it will be appreciated that various modifications, alterations, variations, etc., may be made without departing from the spirit and scope of the invention as defined in the appended claims.

What is claimed:

1. A method of making solid spheres of substantially uniform size and shape comprising the steps of:
   (a) forming a first stream of generally spherical drops of liquid first material in a line-of-flight between a first ejector and a collector;
   (b) forming a second stream of drops of a second material in a line-of-flight between an ejector and the line-of-flight of said first stream;
   (c) causing drops of said second material to collide with drops of said first material in said first line-of-flight and form unitary bodies of substantially uniform size and shape;
   (d) causing said unitary bodies to form substantially solid spheres while in said line-of-flight between said first ejector and a collector; and
   (e) collecting said substantially solid spheres.

2. A method as set forth in claim 1 wherein said streams of drops are formed by:
   (i) forcing a stream of liquid through an ejection device; and
   (ii) exciting said ejection device with electrical signals.

3. A method as set forth in claim 2 wherein said ejection device is an electro-mechanical device.

4. A method as set forth in claim 3 wherein said ejection device is a piezoelectric device.

5. A method as set forth in claim 1 including the step of causing drops of said liquid first material to substantially solidify before colliding with drops of said second material.

6. A method as set forth in claim 1 including the step of causing drops of said liquid second material to substantially solidify before colliding with drops of said first material.

7. A method as set forth in claim 1 including the step of maintaining sufficient heat energy in the drops of first material to cause the second material which collides therewith to form a liquid layer of uniform thickness on the drops of first material.

8. A method as set forth in claim 1 wherein said substantially solid spheres are collected in a container.

9. A method as set forth in claim 1 wherein said substantially solid spheres are deposited on a substrate.

10. A method as set forth in claim 1 wherein said substantially solid spheres are deposited on a substrate in a predetermined pattern.

11. A method as set forth in claim 10 wherein said predetermined pattern is a stack of spheres.

12. A method as set forth in claim 1 wherein said first material is selected from the group of aluminum, lead, tin, copper, gold, nickel, bismuth, gallium, silver, cobalt, cadmium, antimony, silicon, germanium, tellurium, indium and mixtures, solutions or alloys of two or more of such metals.

13. A method as set forth in claim 1 wherein first material has a melting temperature as least about 25° C. higher than the melting temperature of said second material.

14. A method as set forth in claim 1 wherein said first material is a first solder composition and said second material is a second solder composition having a melting temperature lower than the melting temperature of said first solder composition.

15. A method as set forth in claim 1 wherein said first material is solder and said second material is flux.

16. A method as set forth in claim 1 wherein said second material is selected from the group comprising flux, polymer, glass, wax, metals and mixtures, solutions or alloys of metals.

17. The method of claim 2 further comprising the step of mixing said substantially solid spheres into a carrier vehicle to produce a solder paste wherein said substantially solid spheres comprise at least about 80% by weight of said paste.

* * * * *